US006151261A

United States Patent [19]
Sato

[11] Patent Number: 6,151,261
[45] Date of Patent: Nov. 21, 2000

[54] CURRENT DETECTION TYPE SENSE AMPLIFIER

[75] Inventor: Masaharu Sato, Tokyo, Japan

[73] Assignee: NEC Corporation, Tokyo, Japan

[21] Appl. No.: 09/099,525

[22] Filed: Jun. 18, 1998

[30] Foreign Application Priority Data

Jun. 18, 1997 [JP] Japan ................................. 9-160886

[51] Int. Cl.[7] ............................................. G11C 7/02
[52] U.S. Cl. ..................................... 365/207; 365/208
[58] Field of Search ............................ 365/205, 207, 365/208, 226

[56] References Cited

U.S. PATENT DOCUMENTS

| | | | |
|---|---|---|---|
| 5,282,168 | 1/1994 | Takahashi | 365/207 |
| 5,352,941 | 10/1994 | Matsumoto et al. | 326/21 |
| 5,406,148 | 4/1995 | Yokomizo | 365/207 |
| 5,550,778 | 8/1996 | Takahashi | 365/207 |
| 5,694,367 | 12/1997 | Toyoshima et al. | 365/207 |
| 5,742,551 | 4/1998 | Yukutake et al. | 365/207 |
| 5,901,098 | 5/1999 | Sim et al. | 365/207 |

FOREIGN PATENT DOCUMENTS

| | | |
|---|---|---|
| 62-231491 | 10/1987 | Japan . |
| 5-266675 | 10/1993 | Japan . |

OTHER PUBLICATIONS

H. Nambu et al., High–Speed Sensing Techniques for Ultra-high–Speed SRAM's, IEEE Journal of Solid–State Circuits, vol. 27, No. 4, (1992), pp. 632–639.

*Primary Examiner*—Trong Phan
*Attorney, Agent, or Firm*—Foley & Lardner

[57] ABSTRACT

The invention provides a high speed sense amplifier of the current detection type employing NPN transistors used for a static operation type RAM which allows high integration and can suppress increase of power dissipation and deterioration in speed even in a high integration condition. Pairs of bit lines to which data of memory cells of a static type RAM are connected are connected to a pair of common data lines through MOS transistors, and the emitter terminals of a pair of bipolar transistors are connected to the data lines while the collector terminals which serve as signal output terminals of the sense amplifier are connected to a first power supply through resistors and the base terminals are connected to a second power supply. Further, a pair of resistance elements for normally supplying current to the sense amplifier therethrough are connected to the emitter terminals of the bipolar transistors.

4 Claims, 5 Drawing Sheets

CURRENT DETECTION TYPE SENSE AMPLIFIER

BACKGROUND OF THE INVENTION

1. Field of the Invention

The present invention relates to a sense amplifier of a type static RAM, and more particularly to a high speed sense amplifier of the current detection type formed using bipolar transistors.

2. Description of the Related Art

Memory circuits including a sense amplifier of the current detection type in which Bip elements are used are conventionally known, and an exemplary one of the conventional memory circuits is shown in FIG. 5. Referring to FIG. 5, in the memory circuit shown, NPN transistors Q1, Q2 and Q3 serve as elements for selecting a bit line pair B1 and B2. When a bit line selection terminal VYIN1 exhibits a high potential, the bit line pair B1 and B2 is selected by the NPN transistors Q1, Q2 and Q3 and current flows through constant current sources IR1, IR2 and IY. NPN transistors Q4 and Q5 and constant current sources IB1 and IB2 are provided to raise the potentials of the bit lines when the bit line pair is not selected. The emitter terminals of NPN transistors Q6 and Q7 are connected to the bit lines B1 and B2 while the collector terminals of the NPN transistors Q6 and Q7 are connected to the emitter terminals of NPN transistors Q8 and Q9 by data lines D1 and D2, and resistors Rs1 and Rs2 for converting currents, which flow when memory cells 1 connected to the bit line pair B1 and B2, are not selected, into voltages. Control terminals VR1 and VR2 connected to the base terminals of the NPN transistors Q6 and Q7 both exhibit a high potential upon reading of data, but one of control terminals VR1 and VR2 exhibits a low potential upon writing of data. The base terminals of the NPN transistors Q8 and Q9 are connected to a constant voltage source VBB so that the data lines D1 and D2 always exhibit a fixed voltage.

In operation, when the memory cells 1 connected to the bit lines B1 and B2 are not to be accessed, the bit line selection terminal VYIN1 exhibits a low potential, and the terminals VR1, VR2 and VYY exhibit high potentials.

In this instance, if the potential at the terminal VYY is set to a value higher than the voltages at the terminals VR1 and VR2, then current flows through the constant current sources IB1 and IB2 via the transistors Q4 and Q5. Consequently, the potentials of the bit lines B1 and B2 exhibit values lower by a voltage Vf1, which appears between the emitter and the base of each transistor, than the voltage at the terminal VYY. Then, where the voltages at the control terminals VR1 and VR2 are set to voltages with which the bipolar transistors do not operate with respect to the potentials of the bit lines, no current flows through the NPN transistors Q6 and Q7.

Accordingly, even if the voltage of a word line VX2 rises until MOS transistors MT1 and MT2 of one of the memory cells 1 are put into a conducting state, current is supplied only from the NPN transistors Q6 and Q7 and no influence is had on current which flows through the data lines D1 and D2.

In a reading operation, the potential of the selection terminal VYIN1 for the bit line pairs B1 and B2 rises first. Consequently, the NPN transistors Q1 and Q3 are put into a conducting state and the bit lines B1 and B2 and the constant current sources IR1 and IR2 are connected to each other so that current begins to flow therebetween, respectively. Thereupon, since also the NPN transistor Q2 is put into a conducting state, the potentials at the bases of the NPN transistors Q4 and Q5 drop.

Consequently, since the potentials at the terminals VR1 and VR2 become higher than the potentials at the bases of the NPN transistors Q4 and Q5, the potentials of the bit lines B1 and B2 exhibit values lower by the emitter-base voltages Vf of the NPN transistors Q6 and Q7 than those at the terminals VR1 and VR2, respectively. Consequently, the NPN transistors Q6 and Q7 are put into a conducting state.

Accordingly, current flows from the resistors RS1 and RS2 to the bit lines B1 and B2 and the constant current sources IR1 and IR2 through the NPN transistors Q8 and Q9, the data lines D1 and D2 and the NPN transistors Q6 and Q7, respectively. Then, if, in this condition, the potential of the word line VX2 of the memory cell 1 becomes high, then the MOS transistors MT1 and MT2 are put into a conducting state, and current Icell flows to the low potential side nodes of the memory cell 1.

In this instance, since the voltages across the resistors RS1 and RS2 are RS1×(IR1+Icell) and RS2×IR2, respectively, and here RS1=RS2 and IR1=IR2, a potential difference of RS1×Icell appears between output terminals Z1 and Z2. An output can be obtained by amplifying the potential difference by an amplifier in the next stage.

On the other hand, in a writing operation, similar steps of operation to those in the reading operation described above are followed until current Icell flows through the constant current sources IR1 and IR2 as the bit selection terminal VYIN1 is selected and the word line VX2 is selected. Then, in this condition, the potential at the terminal VR1 or VR2 is dropped. Here, if it is assumed that the potential at the terminal VR1 is dropped, then since the potential of the bit line B1 whose potential has dropped becomes a potential lower by the emitter-based voltage Vf than the potential at the terminal VR1, also the voltage of the node of the memory cell 1 which is connected to the bit line B1 drops. Consequently, the transistors MN2 and MP1 in the cell 1 are put into an off state while the transistors MP2 and MN1 are put into an on state, and data is written into the memory cell 1.

Thereafter, the writing operation can be completed by returning the potential at the terminal VR1 to the original high potential. Further, in this instance, since the bit line pair B1 and B2 in a non-selected condition is determined by the transistors Q4 and Q5 and exhibit high potentials, even if the voltage of the terminal VR1 drops, the voltages of the bit lines are not influenced by this, and consequently, no writing operation occurs.

It is to be noted that, in the memory circuit described above, since, as a characteristic of a memory circuit, normally a bit line pair is selected, current of the constant current sources IR1 and IR2 always flow to the data lines D1 and D2 and the potentials of the data lines D1 and D2 are fixed to voltages lower by the emitter-base voltage Vf of the NPN transistors Q8 and Q9 than the constant voltage source VBB.

As described above, in the conventional sense amplifier circuit of the current detection type, since a variation in current is read, even if the potentials at the data lines and the bit lines do not vary, data can be read.

However, the memory circuit shown in FIG. 5 has a subject to be solved in that it exhibits very high power dissipation if cells of a large scale are implemented.

The reason is that, in the conventional memory circuit shown in FIG. 5, since the constant current sources IB1 and IB2 are connected to the bit lines B1 and B2, respectively, current always flows to the constant current sources IB1 and IB2 through the transistors Q4 and Q5 also in those bit lines which are not selected. Consequently, if the number of bit lines is increased in order to increase the memory capacity, then also the current dissipation increases in proportion.

Further, the memory circuit shown in FIG. 5 has another subject to be solved in that it is difficult to achieve higher integration.

The reason is that a plurality of NPN transistors Q1 to Q7 are required for each bit line pair.

The reason why such NPN transistors Q1 to Q7 are required is that, since insulating isolation of MOS transistors can be established by an oxide film formed between the elements, augmentation of arrangement density of elements is easy and reduction in width of memory cells is easy whereas, in Bip elements, in order to isolate collector diffusion layers formed deep, where the voltages to the collectors are different, insulating regions must be formed between collector regions of the transistors and this requires a very large area. For example, where MOS transistors whose gate length is approximately 0.25 $\mu$m are used, it is possible to set the width of each memory cell to 3 $\mu$m or less, but the arrangement pitch of Bip transistors where they are formed based on the same rule as the MOS transistors is required to be 5 $\mu$m or more.

Since the conventional memory circuit shown in FIG. 5 uses the NPN transistors Q1, Q2 and Q3 as switches, the NPN transistors Q1, Q2 and Q3 can be formed from MOS transistors. However, for the transistors Q4 to Q7, since the voltage Vf which appears between the base and the emitter is utilized, at least four NPN transistors are required for each one bit line pair. Consequently, it is difficult to arrange the NPN transistors with a width equal to the width of memory cells.

Furthermore, the conventional memory circuit shown in FIG. 5 has a further subject to be solved in that the speed is low because the potentials of the bit line pair vary upon switching of the bit line pair between a selected condition and a non-selected condition.

The reason is such as follows. In the conventional memory circuit, when a bit line pair is not to be selected, the potentials at the bit line pair are set so that the NPN transistors Q6 and Q7 exhibit a non-conducting state, but when the bit line pair is to be selected, the potential at the terminal VYIN1 is raised to a high potential so as to flow current to the constant current sources IR1 and IR2 to lower the potentials of the bit lines B1 and B2 to put the NPN transistors Q6 and Q7 into a conducting state. While the potentials of the bit lines B1 and B2 must be varied upon reading in this manner, the potential variation of the bit lines B1 and B2 does not occur momentarily due to an influence of additional capacitance parasitic to the bit lines B1 and B2 then. Particularly as the number of memory cells connected to one bit line pair is increased by higher integration, the delay becomes significant. Consequently, the switching time is delayed.

SUMMARY OF THE INVENTION

It is an object of the present invention to provide a sense amplifier of the current detection type employing NPN transistors used for a static operation type RAM which allows high integration and can suppress increase of power dissipation and deterioration in speed even in a high integration condition.

In order to attain the object described above, according to an aspect of the present invention, there is provided a sense amplifier of the current detection type for a static type RAM, comprising a pair of common data lines to which pairs of bit lines to which data of memory cells of the static type RAM are connected are connected through MOS transistors, a pair of bipolar transistors whose emitter terminals are connected to the data lines, a first power supply to which collector terminals of the bipolar transistors which serve as signal output terminals of the sense amplifier are connected through resistors, a second power supply to which base terminals of the bipolar transistors are connected, and a pair of resistance elements connected to emitter terminals of the bipolar transistors for normally supplying current to the sense amplifier therethrough.

According to another aspect of the present invention, there is provided a sense amplifier of the current detection type for a static type RAM, comprising a pair of common data lines to which pairs of bit lines to which data of memory cells of the static type RAM are connected are connected through MOS transistors, a pair of bipolar transistors whose emitter terminals are connected to the data lines, a first power supply to which collector terminals of the bipolar transistors which serve as signal output terminals of the sense amplifier are connected through resistors, a second power supply to which base terminals of the bipolar transistors are connected, and a pair of constant current sources connected to emitter terminals of the bipolar transistors for normally supplying current to the sense amplifier therefrom.

Both of the sense amplifiers of the current detection type may further comprise a potential stabilization circuit connected to each of the pairs of bit lines for the memory cells and including a pair of bipolar transistors whose emitter terminals are connected to the data lines and whose base terminals are connected to a control circuit while collector terminals of the bipolar transistors are connected to a third power supply, whereby, when the memory cells connected to the bit lines are not selected, a base potential to the base terminals of the bipolar transistors is determined so as to be equal to a potential of the data lines.

Otherwise, both of the sense amplifiers of the current detection type may further comprise a potential stabilization circuit connected to each of the pairs of bit lines for the memory cells and including a pair of bipolar transistors whose emitter terminals are connected to the data lines and whose base terminals are connected to a first control circuit while collector terminals of the bipolar transistors are connected to a third power supply, the data lines being connected to each other by the MOS transistors while gate electrodes of the MOS transistors are connected a second control circuit, whereby, when the memory cells connected to the pair of bit lines are not selected, the MOS transistors exhibit a conducting state to make the bit lines have an equal potential and a base potential to the base terminals of the bipolar transistors is determined so as to be equal to a potential of the data lines.

Since the number of bipolar devices connected to each bit line pair is minimized and the resistance elements for normally supplying current to the sense amplifier therethrough or the constant current sources for normally supplying current to the sense amplifier therefrom are connected to the common data lines, when a memory cell is not accessed, no current flows through the associated bit line pair. Consequently, even if the RAM is formed in a high integration, arrangement of the sense amplifier is easy and the sense amplifier the RAM do not involve an increase in power dissipation. Accordingly, high integration can be achieved.

The above and other objects, features and advantages of the present invention will become apparent from the following description and the appended claims, taken in conjunction with the accompanying drawings in which like parts or elements are denoted by like reference symbols.

DESCRIPTION OF THE PREFERRED EMBODIMENT

Figure 1:
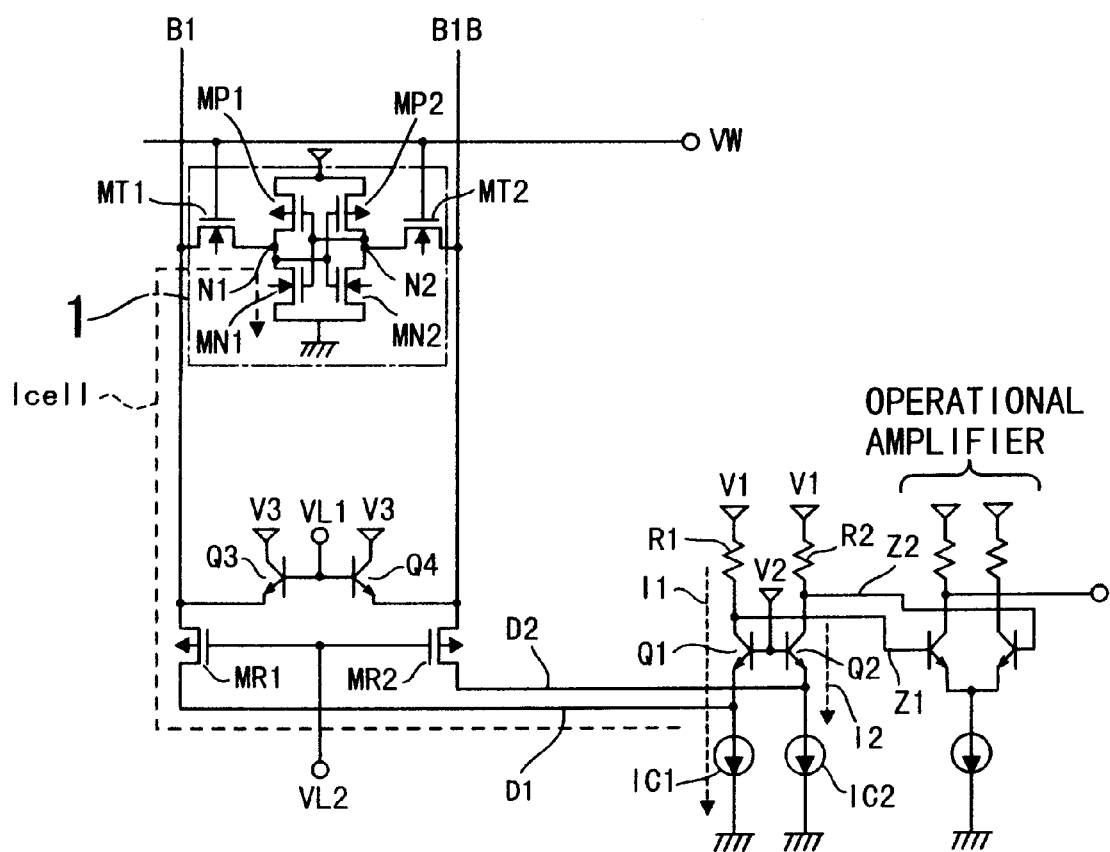
FIG. 1 is a circuit diagram of a sense amplifier to which the present invention is applied.

Referring first to FIG. 1, there is shown in circuit diagram a sense amplifier to which the present invention is applied. Bit lines B1 and B2 connected to a memory cell 1 are connected to common data lines D1 and D2 through MOS transistors MR1 and MR2 for reading, respectively. The gate terminals of the MOS transistors MR1 and MR2 are connected to a control terminal VL2. The emitter terminals of NPN transistors Q1 and Q2 and constant current sources IC and IC2 are connected to the data lines D1 and D2, respectively, and the base terminals of the NPN transistors Q1 and Q2 are connected to a power supply V2 while the collector terminals are connected to another power supply V1 through resistors R1 and R2 for converting currents into voltages. The emitter terminals of NPN transistors Q3 and Q4 for making the potentials of bit lines B1 and B2 equal to those of the common data lines D1 and D2 are connected to the bit lines B1 and B2, and the collector terminals of the NPN transistors Q3 and Q4 are connected to a power supply V3 while the base terminals are connected to a control terminal VL1.

Operation of the sense amplifier is described now. First, a condition wherein the memory cell 1 is not selected is examined. In this condition, the MOS transistors MR1 and MR2 for data reading are in a non-conducting state, and currents which flow through the resistors R1 and R2 pass the NPN transistors Q1 and Q2 and flow into the constant current sources IC and IC2, respectively Consequently, the voltages appearing across the resistors R1 and R2 are given as the current value I1 of the constant current source IC1×R1 and the current value I2 of the constant current source IC2×R2, respectively, and if the resistors R1 and R2 and the current values I1 and I2 are set so that I1=I2 and R1=R2, then the potential difference between terminals Z1 and Z2 is reduced to zero. Consequently, no data is outputted from the memory cell 1.

Further, since the NPN transistors Q1 and Q2 are in a conducting state and fixed currents always flow therethrough, a fixed potential difference Vf1 appears between the base terminal and the emitter terminal of each of the NPN transistors Q1 and Q2. Further, the voltage at the control terminal VL1 is set so that the voltages of the bit lines B1 and B2 connected to the emitters of the NPN transistors Q3 and Q4 may be equal to the voltages of the data lines D1 and D2, respectively.

Now, a data reading operation is examined. In this instance, the voltage to the control terminal VL2 is varied to put the MOS transistors MR1 and MR2 for reading into a conducting state while the voltage to the control terminal VL1 is dropped simultaneously to put the NPN transistors Q3 and Q4 for voltage stabilization of the bit lines B1 and B2 into a non-conducting state.

Consequently, the bit lines B1 and B2 and the data lines D1 and D2 are connected to each other through the MOS transistors MR1 and MR2, respectively. In this instance, since the potentials of the data lines D1 and D2 and the bit lines B1 and B2 are adjusted so as to be equal to each other, respectively, no current flows between the data lines D1 and D2 and the bit lines B1 and B2, respectively.

Then, in this condition, the potential of a word line VW connected to the memory cell 1 is raised to put the MOS transistors MT1 and MT2 for selection of the memory cell 1 into a conducting state to select the memory cell 1. In this instance, if it is assumed that the node N1 side in the memory cell 1 is in a low voltage condition and the node N2 side is in a high voltage condition, then current Icell flows into the node N1 of the low voltage side in the memory cell 1.

Since this current Icell is supplied from the power supply V1 through a resistor R1, the current which flows through the resistor R1 is given as the current value I1 of the constant current source IC1+Icell. Meanwhile, since the value of the current flowing through another resistor R2 does not vary, a voltage difference of Icell×resistor R1 appears between the output terminals Z1 and Z2. Then, this potential difference is amplified by an operational amplifier connected in the next stage, thereby providing an output of the memory cell 1. It is to be noted that, since each of the bit lines B1 and B2 has a parasitic wiring line resistance Rbit, the potential of the bit line B1 drops by Rbit×Icell. Further, the current then is the sum between the current value I1 of the constant current source IC1+Icell and the current value I2 of the constant current source IC2.

Subsequently, operation when reading comes to an end is examined. In this instance, the potential of the word line VW is dropped to put the MOS transistors MT1 and MT2 of the memory cell 1 into a non-conducting state, and the voltage of the control terminal VL2 is varied to put also the MOS transistors MT1 and MT2 for reading into anon-conducting state. Consequently, the data lines D1 and D2, the bit lines B1 and B2 and the memory cell 1 are disconnected from each other. Then, if the voltage of the control terminal VL1 is simultaneously raised to put the NPN transistors Q3 and Q4 into a conducting state, then the voltage of the bit line B1 which has dropped a little returns momentarily to the potential equal to that of the data lines D1 and D2. Here, the reason why the potentials of the bit lines B1 and B2 and the data lines D1 and D2 are made equal to each other is such as follows. In particular, if the potentials of the bit lines B1 and B2 and the potentials of the data lines D1 and D2 are different from each other, then when the MOS transistors MR1 and MR2 for reading are put into a conducting state in the next time, the bit lines B1 and B2 and the data lines D1 and D2 are connected to each other, whereupon current flows from the data line D1 which has a comparatively high potential to the bit line B1 which has a comparatively low potential. Then, since this current appears as a voltage variation by the sense amplifier, wrong data is outputted until after the potentials of the data lines and the bit lines are stabilized.

Figure 2:
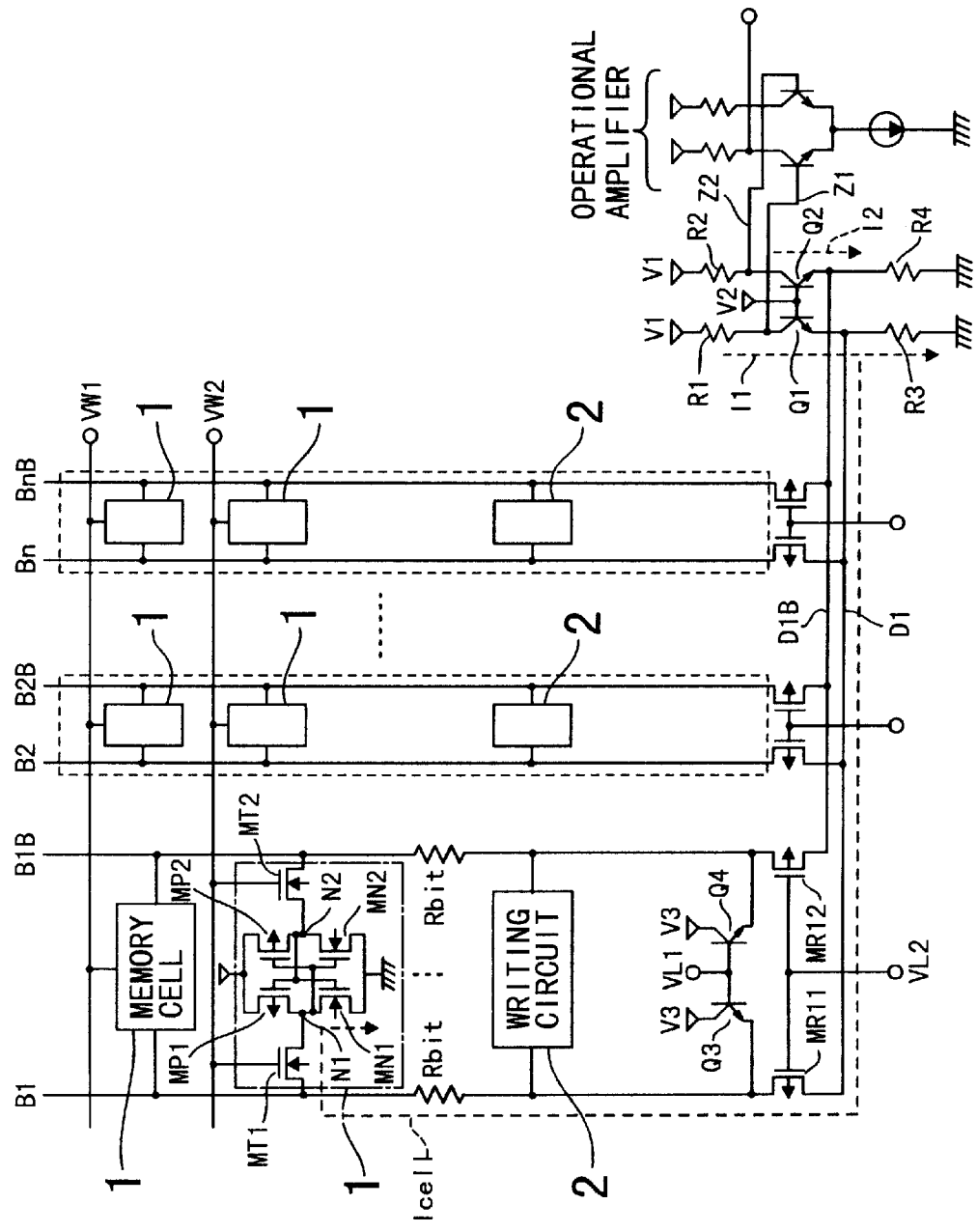
FIG. 2 is a circuit diagram showing a memory circuit in which the sense amplifier of FIG. 1 is used.

FIG. 2 shows in circuit diagram a memory circuit in which the sense amplifier described above with reference to FIG. 1 is incorporated.

Referring to FIG. 2, bit lines B1 and B1B of a first pair to which a plurality of memory cell 1 are connected are connected to common data lines D1 and D1B through P-channel MOS transistors MR11 and MR12 for reading, respectively. Further, bit lines B2 and B2B, . . . , and Bn and BnB of the other pairs are connected to the common data lines D1 and D1B similarly through P-channel MOS transistors (MR11 and MR12) for reading, respectively. The gate terminals of the P-channel MOS transistors MR11 and MR12 are connected to a control terminal VL2. The data lines D1 and D1B are connected to the emitter terminals of NPN transistors Q1 and Q2 and resistors R3 and R4, and the base terminals of the NPN transistors Q1 and Q2 are connected to a power supply V2 while the collector terminals which serve as output terminals Z1 and Z2 are connected to another power supply V1 through resistors R1 and R2 provided for converting current into voltage, respectively. Further, to the bit lines B1 and B1B of the first pair, the emitter terminals of NPN transistors Q3 and Q4 for controlling, when the bit lines B1 and B1B are to be selected, the potentials of the bit lines B1 and B1B equal to those of the common data lines D1 and D1B, respectively, and the collector terminals of the NPN transistors Q3 and Q4 are connected to a power supply V3 while the base terminals are connected to the control terminal VL1. Also the bit lines of the other pairs are constructed in a similar manner as just described.

Subsequently, operation of the memory circuit shown in FIG. 2 is described with reference to the flow chart shown in FIG. 3.

Figure 3:
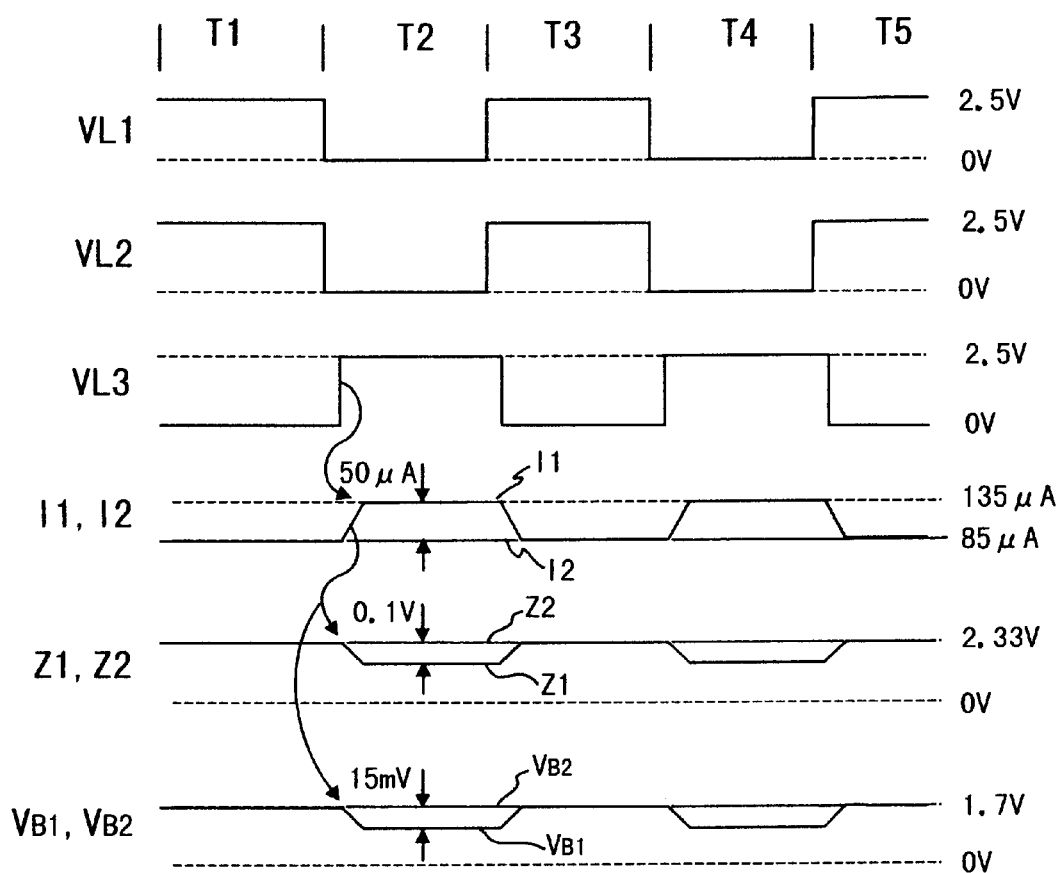
FIG. 3 is a timing chart illustrating operation of the memory circuit of FIG. 2.

Referring to FIG. 3, in a cycle T1, voltages at various terminals of the circuit when a certain memory cell 1 is not accessed are illustrated. In this condition, since the potential of the control terminal VL2 is high, the P-channel MOS transistors MR11 and MR12 for data reading are in a non-conducting state, and currents supplied through the resistors R1 and R2 pass through the NPN transistors Q1 and Q2 and flow into the resistors R3 and R4, respectively.

In this instance, if the power supply V1=2.5 V and V2=2.5 V, then since the NPN transistors Q1 and Q2 are in a conducting state, a fixed potential difference Vf1 appears between the base terminals and the emitter terminals of them. Here, if it is assumed that the potential difference Vf1 is 0.8 V, then the voltage between the common data lines D1 and D1B is normally fixed to V2−Vf1=2.5−0.8=1.7 V. Since the voltages of the data lines D1 and D1B are normally 1.7 V, where the resistance values of the resistors R3 and R4 are 20 KΩ, then the currents I1 and I2 flowing through the resistors R1 and R2 are both 1.7 V÷20 KΩ=85 µA, and the currents are supplied from the power supply V1 through the resistors R1 and R2. Consequently, if it is assumed that the resistance values of the resistors R1 and R2 are 2 KΩ, then the voltage at the output terminal Z1 is V1−R1×I1=2.5 V−85 µA×2,000 Ω=2.33 V, and also the voltage at the output voltage Z2 is 2.33 V similarly.

In this manner, in a condition wherein the memory cell 1 is not accessed, no data is outputted from the memory cell 1 since there is no potential difference between the output terminals Z1 and Z2. Further, since some current flows through the MOS transistors which form the memory cell 1 also when they are in a non-conducting state, if the base potential VL1 of the NPN transistors Q3 and Q4 connected to the bit lines is raised to a high potential, then the NPN transistors Q3 and Q4 are put into a conducting state, and the voltages at the emitter terminals connected to the bit lines B1 and B1B exhibit voltages lower by a fixed potential difference Vf2 than the potential of the control terminal VL1 of the bases of the NPN transistors Q3 and Q4.

Here, since the currents which flow through the NPN transistors Q3 and Q4 are much lower than those which flow through the NPN transistors Q1 and Q2, if the NPN transistors Q3 and Q4 and the NPN transistors Q1 and Q2 are formed from same transistors, then the potential difference Vf2 is lower than the potential difference Vf1. Accordingly, it is necessary to allow the voltage equal to that at the terminal V2, that is, 2.5 V, to be used as the potential of the control terminal VL1 either by setting the potential of the control terminal VL1 lower by the difference between the potential difference Vf2 and the potential difference Vf1 than the potential at the terminal V2 or by modifying the shape of the NPN transistors Q3 and Q4 so that the potential difference Vf2 of them may be 0.8 equal to the potential of the potential difference Vf1.

By the countermeasure just described, also the voltages between the bit lines B1 and B1B can be controlled to (potential at the terminal V2−Vf2)=0.8 V. Then, in this instance, since the current which flows through the circuit is the sum of the currents I1 and I2, that is, 170 µA, because the currents flowing through the NPN transistors Q3 and Q4 are so low that they can be ignored.

Subsequently, operation of the memory circuit in a condition of a cycle T2 of FIG. 3 which is a data reading cycle. In this instance, the voltages at the control terminals VL2 and VL1 are dropped. Consequently, the P-channel MOS transistors MR11 and MR12 for reading are put into a conducting state and simultaneously the base potentials of the NPN transistors Q3 and Q4 for voltage stabilization connecting to the bit lines B1 and B1B drop. Consequently, the transistors Q3 and Q4 are put into a non-conducting state.

Consequently, the bit lines B1 and B1B and the data lines D1 and D1B are connected by the P-channel MOS transistors MR11 and MR12, respectively. In this instance, since the potentials of the data lines D1 and D1B and the bit lines B1 and B1B are adjusted so as to be equal to each other, no current flows between the bit lines B1 and B1B and the data lines D1 and D1B, respectively. Then, if, in this condition, the potential of the word line VW2 connected to the memory cell 1 is changed to a high potential, then the MOS transistors MT1 and MT2 for selection of the memory cell 1 are put into a conducting state, and the memory cell 1 is selected. In this instance, if it is assumed that the node N1 side in the memory cell 1 is in a low voltage condition and the node N2 side is in a high voltage condition, then current Icell flows into the node N1 on the low voltage side in the memory cell 1.

Then, if it is assumed that the current Icell is 50 µA, then since this current is supplied from the power supply V1 through the resistor R1, the current which flows through the resistor R1 is I1+Icell µA=85 µA+50 µA=135 µA, and the voltage of the output terminal Z1 is the voltage of the power supply V1−(I1+Icell)×R1=2.5 V−135 µA×2,000 Ω=2.23 V. In this instance, since the current which flows through the resistor R2 exhibits no variation, the voltage at the output terminal Z2 remains 2.33 V. Consequently, the potential difference of 0.1 V appears between the output terminals Z1 and Z2. Then, this potential difference is amplified by an operational amplifier connected in the next stage, thereby obtaining an output of the memory cell 1.

Further, in this instance, since each of the bit lines B1 and B1B have a parasitic resistance Rbit, the potentials of them drop a little. For example, where totaling 512 memory cells 1 whose size is 3 µm×4 µm are connected to the bit lines B1 and B1B whose resistance is 70 mΩ/µm, the resistance value of the parasitic resistance Rbit of each of the bit lines is, with the cell located farthest, approximately 300 Ω. In this instance, since the current Icell=50 μA, the potential of the bit line B1 drops 300 Ω×50 μA=15 mV and drops a little to 1.7−0.015=1.685 V. It is to be noted that the total current flowing through the circuit is the sum of the current value of the constant current source IC1+Icell and the current value of the constant current source IC2 and is 220 μA.

Now, a cycle T3 after reading is completed is examined. In this instance, the potential of the word line VW2 drops and the potentials of the control terminals VL1 and VL2 rise. Consequently, the transistors MT1 and MT2 of the memory cell 1 are put into a non-conducting state and disconnected from the bit lines B1 and B1B. Further, the P-channel MOS transistors MR11 and MR12 for reading are put into a non-conducting state, and also the data lines D1 and D1B and the bit lines B1 and B1B are disconnected from each other, respectively. Simultaneously, the transistors Q3 and Q4 are put into a conducting state. Consequently, the voltage of the bit line B1 with which the voltage has dropped returns to 1.7 V which is equal to the potential of the data line D1.

The reading operation of the circuit shown in FIG. 2 proceeds in such a manner as described above. Meanwhile, although writing circuits 2 are not particularly shown in FIG. 2, if the potential of the control terminal VL1 is dropped to put the NPN transistors Q3 and Q4 into a non-conducting state while the control terminal VL2 is kept at a high potential, putting the P-channel MOS transistors MR11 and MR12 into a non-conducting state, raising the potential of the word line VW2 to put the memory cell 1 and the bit lines B1 and B1B into a conducting state therebetween and, in this condition, lowering the potential at the bit line B1 or B1B, a writing operation can be performed.

Figure 4:
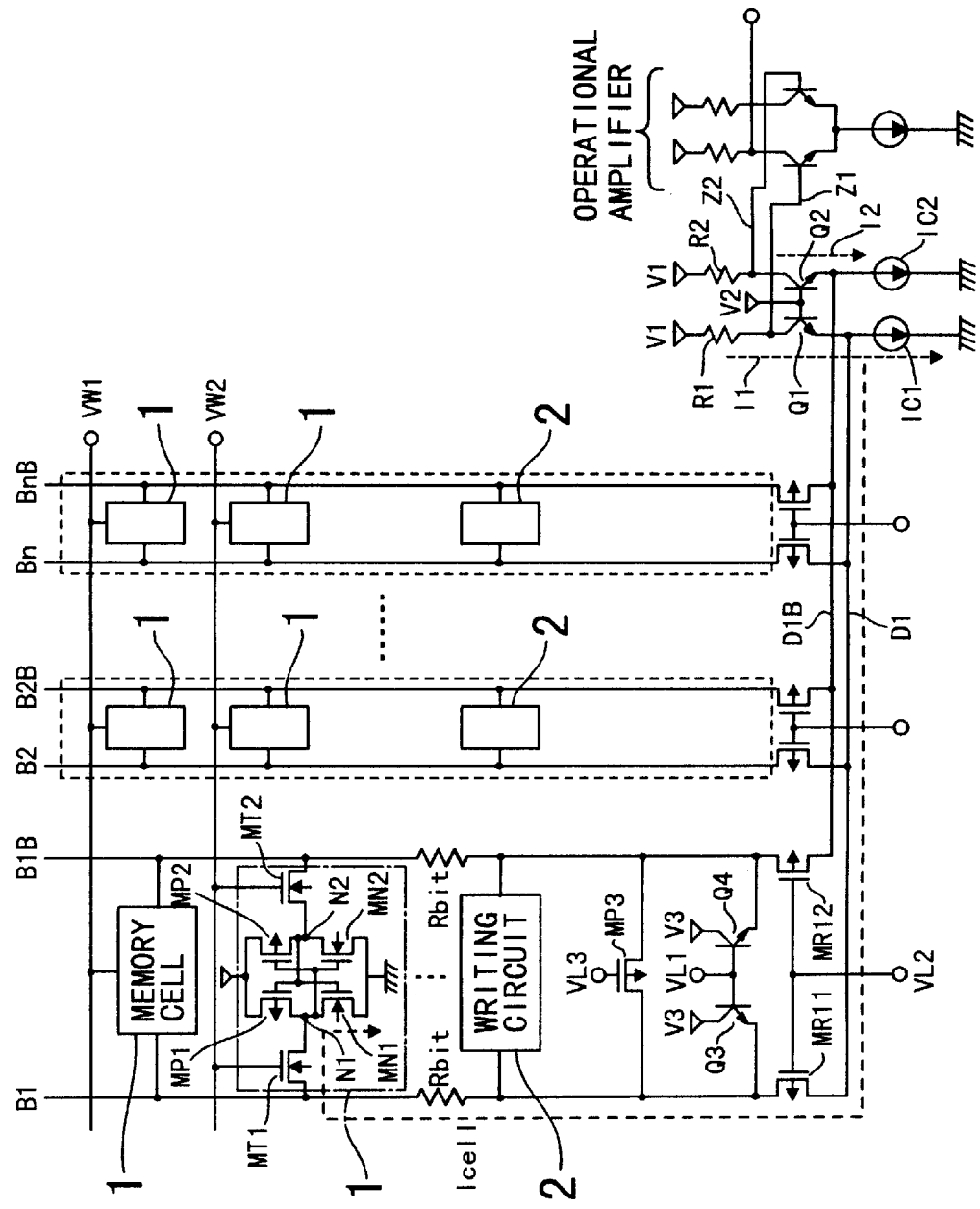
FIG. 4 is a circuit diagram showing another memory circuit in which the sense amplifier of FIG. 1 is used.
Figure 5:
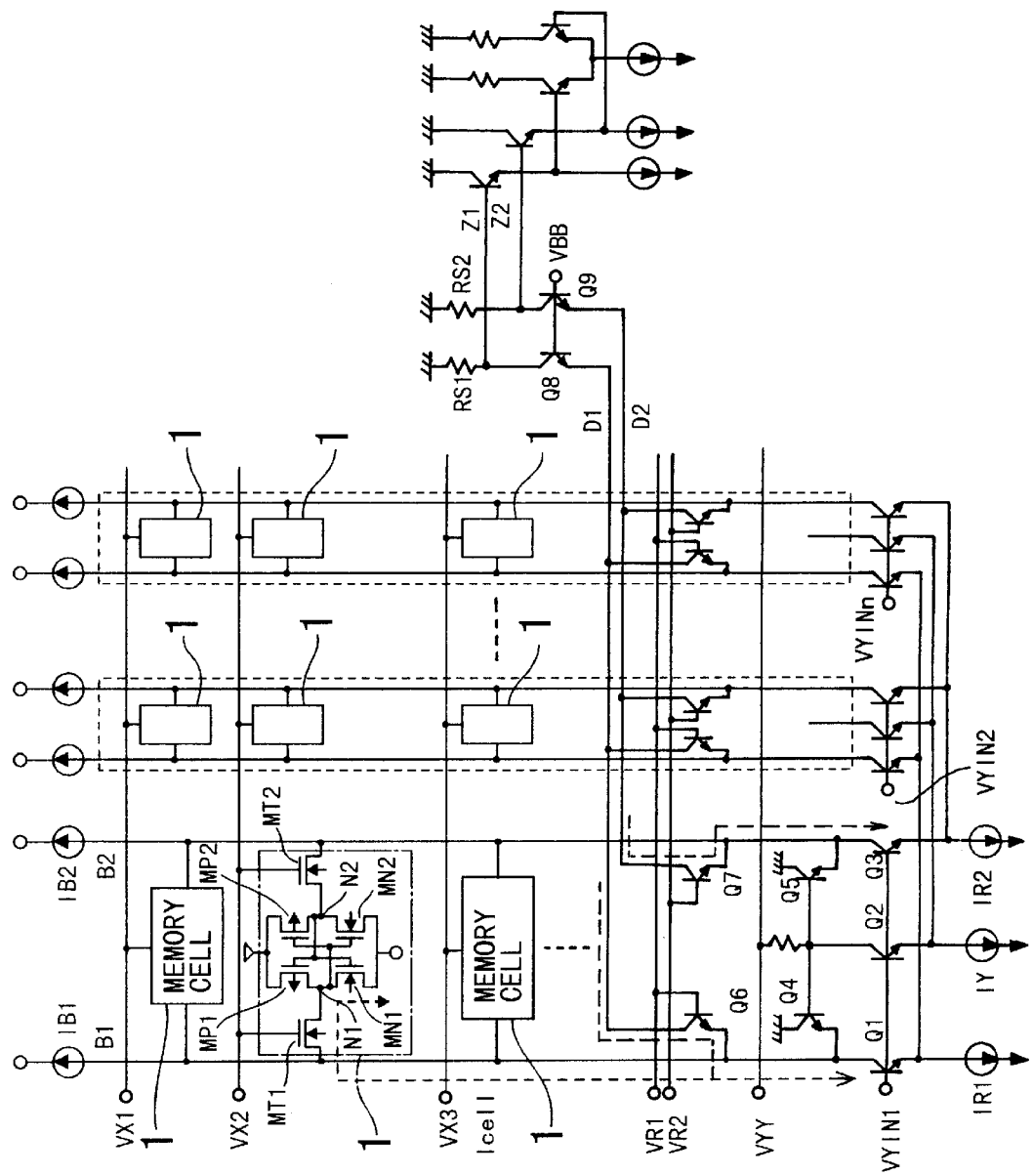
FIG. 5 is a circuit diagram showing a conventional memory circuit in which a sense amplifier is used.

FIG. 4 shows in circuit diagram another memory circuit in which the sense amplifier described hereinabove with reference to FIG. 1 is incorporated.

Referring to FIG. 4, the memory circuit shown is a modification to the memory circuit described hereinabove with reference to FIG. 2. In particular, bit lines B1 and B1B of a first pair to which a plurality of memory cells 1 are connected are connected to the data lines D1 and D1B through P-channel MOS transistors MR11 and MR12 for reading, respectively. Further, bit lines B2 and B2B, . . . , and Bn and BnB of the other pairs are connected to the common data lines D1 and D1B through respective P-channel MOS transistors MR11 and MR12 for reading similarly. For each bit line pair, the gate terminals of the P-channel MOS transistors MR11 and MR12 are connected to a control terminal VL2. The data lines D1 and D1B are connected to the emitter terminals of the NPN transistors Q1 and Q2.

Further, in the memory circuit of FIG. 4, constant current sources IC1 and IC2 are connected to the data lines D1 and D1B in place of the resistors R3 and R4 employed in the memory circuit of FIG. 2, respectively. Then, the base terminals of the NPN transistors Q1 and Q2 are connected to a power supply V2 while the collector terminals of the NPN transistors Q1 and Q2 which serve as terminals Z1 and Z2 are connected to another power supply V1 through resistors R1 and R2 for converting current into voltage. Further, the emitter terminals of NPN transistors Q3 and Q4 for making the potentials of the bit lines B1 and B1B when the bit lines B1 and B1B are not selected equal to the potentials of the common data lines D1 and D1B are connected to the bit lines B1 and B1B, respectively, and the collectors of the NPN transistors Q3 and Q4 are connected to a power supply V3 while the bases of them are connected to a control terminal VL1. Further, a P-channel MOS transistor MP3 for short-circuiting the bit lines B1 and B1B when they are accessed is connected between the bit lines B1 and B1B, and the gate terminal of the P-channel MOS transistor MP3 is connected to a control terminal VL3.

Operation of the memory circuit of FIG. 4 is described now.

Here, basic operation of the memory circuit of FIG. 4 is similar to that of the memory circuit of FIG. 2, but is different in that, while, in the memory circuit of FIG. 2, the resistors R3 and R4 are connected to the data lines D1 and D1B, respectively, in the memory circuit of FIG. 4, the constant current sources IC1 and IC2 are connected to the data lines D1 and D1B, respectively.

Where resistance elements are employed as in the memory circuit of FIG. 2, the currents which flow through the resistors are liable to vary by a variation of the power supply voltage, and this varies the output voltage. However, where constant current sources are employed as in the memory circuit of FIG. 4, even if the power supply voltage varies, the currents exhibit a comparatively small variation. Consequently, employment of constant current sources is advantageous in that the output variation can be suppressed and operation which is higher in stability can be realized.

The memory circuit of FIG. 4 is different from the memory circuit of FIG. 2 also in that the P-channel MOS transistor MP3 for short-circuiting the bit lines B1 and B1B when the bit lines B1 and B1B are not selected is connected between the bit lines B1 and B1B.

In the memory circuit of FIG. 2, since the potentials of the bit lines B1 and B1B are determined only by the NPN transistors Q3 and Q4, the currents which flow through the NPN transistors Q3 and Q4 are very low and the potentials of the bit lines B1 and B1B are liable to become unstable, and consequently, there is the possibility that the potentials of the bit lines B1 and B1B may become different from each other. In contrast, where the P-channel MOS transistor MP3 is connected between the bit lines B1 and B1B and the potential of the terminal VL3 (the base terminal of the transistor MP3) when the bit lines B1 and B1B are not selected is set to a low potential to put the transistor MP3 into a conducting state to short-circuit the bit lines B1 and B1B, there is an advantage that the potentials of the bit lines B1 and B1B can be further stabilized.

As described above, when a memory cell is not selected, the current which flows through the circuit is only the current values I1 and I2, but when the memory cell is selected, only the current Icell flows in addition to the current values I1 and I2. This situation does not change even if the number of bit lines connected to one data line increases. Consequently, power dissipation can be suppressed remarkably.

Further, since those NPN transistors connected to a pair of bit lines are only the NPN transistors Q3 and Q4 for voltage stabilization and the collector terminals of the transistors are all connected to the power supply V3, the collectors of the NPN transistors need not be isolated from each other and can be located closely to each other. Consequently, the arrangement density of NPN transistors can be augmented, and even if the size of memory cells is reduced, arrangement of the NPN transistors can be performed readily.

Further, since the sense amplifier has a circuit construction which suppresses the voltage variations of the bit lines and the data lines to the utmost, even when switching between a non-selection condition and a selection condition of the memory occurs, no voltage variation occurs, and the time for charging parasitic capacitances of the bit lines is not required. Consequently, a higher accessing speed can be anticipated.

While preferred embodiments of the present invention have been described using specific terms, such description is for illustrative purpose only, and it is to be understood that changes and variations may be made without departing from the spirit or scope of the following claims.

What is claimed is:

1. A sense amplifier of the current detection type as claimed, comprising:
   a pair of common data lines connected through MOS transistors to pairs of bit lines, to which data of memory cells of said static type RAM are connected;
   a pair of bipolar transistors whose emitter terminals are connected to said data lines;
   a first power supply connected through resistors to collector terminals of said bipolar transistors, which serve as signal output terminals of said sense amplifier;
   a second power supply connected to base terminals of said bipolar transistors;
   a pair of resistance elements connected to emitter terminals of said bipolar transistors for normally supplying current to said sense amplifier therefrom; and
   a potential stabilization circuit connected to each of said pairs of bit lines for said memory cells and including a pair of bipolar transistors whose emitter terminals are connected to said bit lines and whose base terminals are connected to a control circuit while collector terminals of said bipolar transistors are connected to a third power supply, whereby, when the memory cells connected to the bit lines are not selected, a base potential to said base terminals of said bipolar transistors is determined so as to be equal to a potential of said data lines.

2. A sense amplifier of the current detection type as claimed, comprising:
   a pair of common data lines connected through MOS transistors to pairs of bit lines, to which data of memory cells of said static type RAM are connected;
   a pair of bipolar transistors whose emitter terminals are connected to said data lines;
   a first power supply connected through resistors to collector terminals of said bipolar transistors, which serve as signal output terminals of said sense amplifier;
   a second power supply connected to base terminals of said bipolar transistors;
   a pair of resistance elements connected to emitter terminals of said bipolar transistors for normally supplying current to said sense amplifier therefrom; and
   a potential stabilization circuit connected to each of said pairs of bit lines for said memory cells and including a pair of bipolar transistors whose emitter terminals are connected to said bit lines and whose base terminals are connected to a first control circuit while collector terminals of said bipolar transistors are connected to a third power supply, said bit lines being connected to each other by said MOS transistors while gate electrodes of said MOS transistors are connected to a second control circuit, whereby, when the memory cells connected to the pair of bit lines are not selected, said MOS transistors exhibit a conducting state to make the bit lines have an equal potential, and a base potential to said base terminals of said bipolar transistors is determined so as to be equal to a potential of said data lines.

3. A sense amplifier of the current detection type for a static type RAM, comprising:
   a pair of common data lines connected through MOS transistors to pairs of bit lines, to which data of memory cells of said static type RAM are connected;
   a pair of bipolar transistors whose emitter terminals are connected to said data lines;
   a first power supply connected through resistors to collector terminals of said bipolar transistors, which serve as signal output terminals of said sense amplifier;
   a second power supply connected to base terminals of said bipolar transistors;
   a pair of constant current sources connected to emitter terminals of said bipolar transistors for normally supplying current to said sense amplifier therefrom; and
   a potential stabilization circuit connected to each of said pairs of bit lines for said memory cells and including a pair of bipolar transistors whose emitter terminals are connected to said bit lines and whose base terminals are connected to a control circuit while collector terminals of said bipolar transistors are connected to a third power supply, whereby, when the memory cells connected to the bit lines are not selected, a base potential to said base terminals of said bipolar transistors is determined so as to be equal to a potential of said data lines.

4. A sense amplifier of the current detection type for a static type RAM, comprising:
   a pair of common data lines connected through MOS transistors to pairs of bit lines, to which data of memory cells of said static type RAM are connected;
   a pair of bipolar transistors whose emitter terminals are connected to said data lines;
   a first power supply connected through resistors to collector terminals of said bipolar transistors, which serve as signal output terminals of said sense amplifier;
   a second power supply connected to base terminals of said bipolar transistors;
   a pair of constant current sources connected to emitter terminals of said bipolar transistors for normally supplying current to said sense amplifier therefrom; and
   a potential stabilization circuit connected to each of said pairs of bit lines for said memory cells and including a pair of bipolar transistors whose emitter terminals are connected to said bit lines and whose base terminals are connected to a first control circuit while collector terminals of said bipolar transistors are connected to a third power supply, said bit lines being connected to each other by said MOS transistors while gate electrodes of said MOS transistors are connected to a second control circuit, whereby, when the memory cells connected to the pair of bit lines are not selected, said MOS transistors exhibit a conducting state to make the bit lines have an equal potential, and a base potential to said base terminals of said bipolar transistors is determined so as to be equal to a potential of said data lines.

* * * * *